(12) United States Patent
Huang et al.

(10) Patent No.: US 10,490,432 B2
(45) Date of Patent: Nov. 26, 2019

(54) WAFER CARRIER

(71) Applicant: GlobalWafers Co., Ltd., Hsinchu (TW)

(72) Inventors: Yen-Lun Huang, Hsinchu (TW);
Chien-Jen Sun, Hsinchu (TW);
Ying-Ru Shih, Hsinchu (TW);
Wen-Ching Hsu, Hsinchu (TW)

(73) Assignee: GlobalWafers Co., Ltd., Hsinchu (TW)

(*) Notice: Subject to any disclaimer, the term of this patent is extended or adjusted under 35 U.S.C. 154(b) by 327 days.

(21) Appl. No.: 15/456,562

(22) Filed: Mar. 12, 2017

(65) Prior Publication Data
US 2017/0263482 A1 Sep. 14, 2017

(30) Foreign Application Priority Data
Mar. 14, 2016 (TW) .............................. 105107719 A

(51) Int. Cl.
*H01L 21/673* (2006.01)
*H01L 21/687* (2006.01)

(52) U.S. Cl.
CPC .. *H01L 21/67383* (2013.01); *H01L 21/68735* (2013.01); *H01L 21/68764* (2013.01); *H01L 21/68771* (2013.01)

(58) Field of Classification Search
USPC .............. 206/712, 710, 445, 563, 564, 711; 451/269; 220/507, 500
See application file for complete search history.

(56) References Cited

U.S. PATENT DOCUMENTS

| | | | | |
|---|---|---|---|---|
| 6,909,177 B2* | 6/2005 | Kang | ................ | H01L 21/67333 257/710 |
| 2012/0171870 A1* | 7/2012 | Mitrovic | ........... | C23C 16/45504 438/706 |
| 2015/0118009 A1* | 4/2015 | Hsieh | ................ | H01L 21/68735 414/800 |
| 2015/0211148 A1* | 7/2015 | Krishnan | ................ | C30B 25/12 118/728 |

\* cited by examiner

*Primary Examiner* — J. Gregory Pickett
*Assistant Examiner* — Tia Cox
(74) *Attorney, Agent, or Firm* — Osha Liang LLP

(57) ABSTRACT

A wafer carrier for processing a plurality of wafers includes a carrier body which rotatable about a central axis, and a plurality of pockets formed in the carrier body. Each of the pockets has an access opening and an inner periphery surface extending from the access opening to terminate at a floor surface. A lower periphery region of the inner periphery surface has a most distal region which is most distal from the central axis. When the carrier body is rotated about the central axis, a corresponding one of the wafers is less likely to be damaged due to a centrifugal force applied to the corresponding one of the wafers.

15 Claims, 5 Drawing Sheets

WAFER CARRIER

CROSS-REFERENCE TO RELATED APPLICATION

This application claims priority to Taiwanese patent application no. 105107719, filed on Mar. 14, 2016, the entirety of which is hereby incorporated herein by reference.

FIELD

The disclosure relates to a wafer carrier, more particularly to a wafer carrier for epitaxial processing of wafers.

BACKGROUND

Typically, semiconductors devices are formed by epitaxial growing of successive semiconductor layers on substrates, i.e., wafers, using chemical vapor deposition (CVD) processes. In a CVD process, a plurality of wafers which are placed in pockets of a wafer carrier, and which are kept in an elevated temperature, are exposed to precursor gases, and the precursor gases react and are deposited epitaxially on the wafers to form a semiconductor layer. To obtain uniform semiconductor layers of the wafers, considerable effort has been devoted to maintain wafers in uniform conditions. For example, a conventional wafer carrier disclosed in US patent publication no. 2010/0055318. Thus, for evenly treating the wafers on the wafer carrier, in a typical CVD process, the wafer carrier is rotated about its central axis. As the centrifugal force will be generated as a result of rotation of the wafer carrier, each wafer placed on the wafer carrier will unavoidably be forced to engage an inner periphery of a corresponding one of the pockets, thereby resulting in undesirable defects such as slip lines on peripheries of the wafers.

SUMMARY

Therefore, an object of the disclosure is to provide a novel wafer carrier. When the novel wafer carrier is rotated during a semiconductor process, wafers placed on the wafer carrier are less likely to have defects on their peripheries.

According to the disclosure, a wafer carrier for processing a plurality of wafers is provided. Each of the wafers has a top bevel edge and an orientation flat. The wafer carrier includes a carrier body and a plurality of pockets. The carrier body is rotatable about a central axis, and has an upper surface and a lower surface opposite to the upper surface in a direction of the central axis. The pockets are angularly displaced from each other about the central axis. Each of the pockets defines a pocket axis, and has an access opening and an inner periphery surface. The access opening is formed in the upper surface. The inner peripheral surface extends from the access opening toward the lower surface to terminate at a floor surface so as to define an accommodation space which is configured to permit a corresponding one of the wafers to be placed therein through the access opening. The inner periphery surface has an uppermost region, a circumferential inclined ceiling region, and a lower periphery region. The uppermost region extends from the access opening to terminate at a circumferential juncture area. The circumferential inclined ceiling region extends downwardly from the circumferential juncture area and radially and outwardly from the pocket axis to terminate at a joint region, and is configured to confront the top bevel edge of the corresponding one of the wafers. The lower periphery region extends upwardly from a marginal edge of the floor surface to terminate at an upper edge which is leveled with the joint region. The lower periphery region has a most distal zone which is most distal from the central axis, and which is configured such that only the most distal zone is permitted to be engaged with the corresponding one of the wafers when the carrier body is rotated about the central axis.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
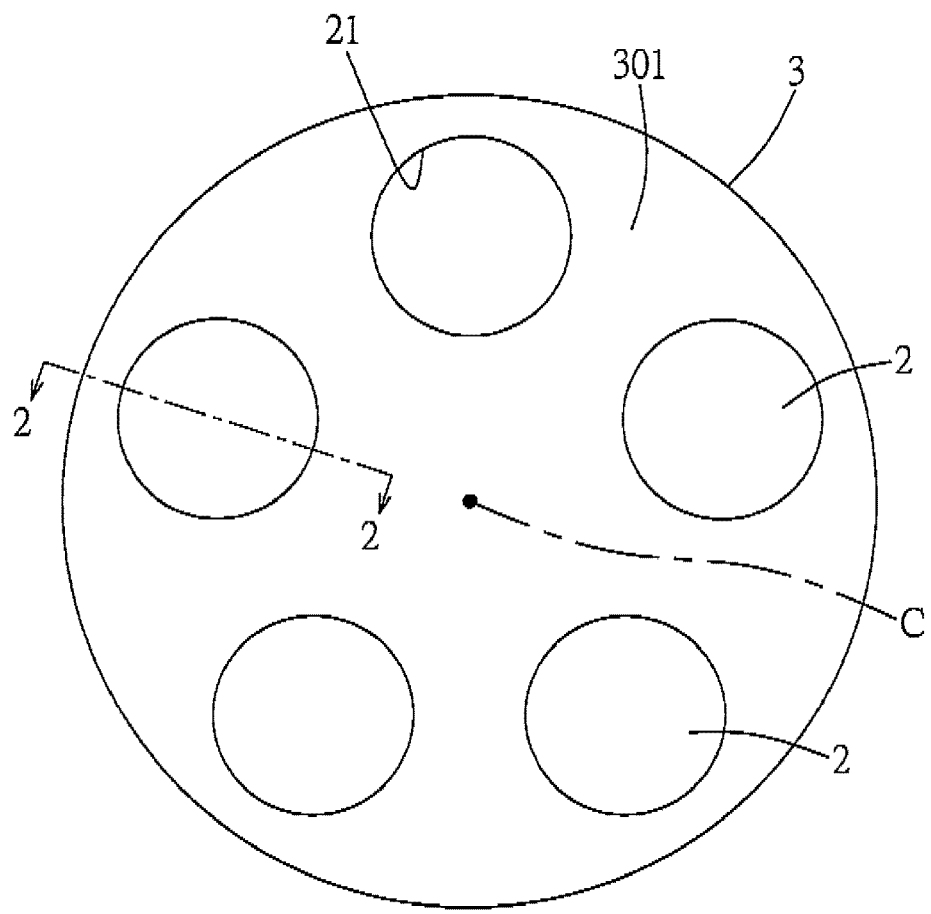
FIG. 1 is a top schematic view of a wafer carrier according to a first embodiment the disclosure.

Before the disclosure is described in greater detail, it should be noted that where considered appropriate, reference numerals have been repeated among the figures to indicate corresponding or analogous elements, which may optionally have similar characteristics.

Figure 2:
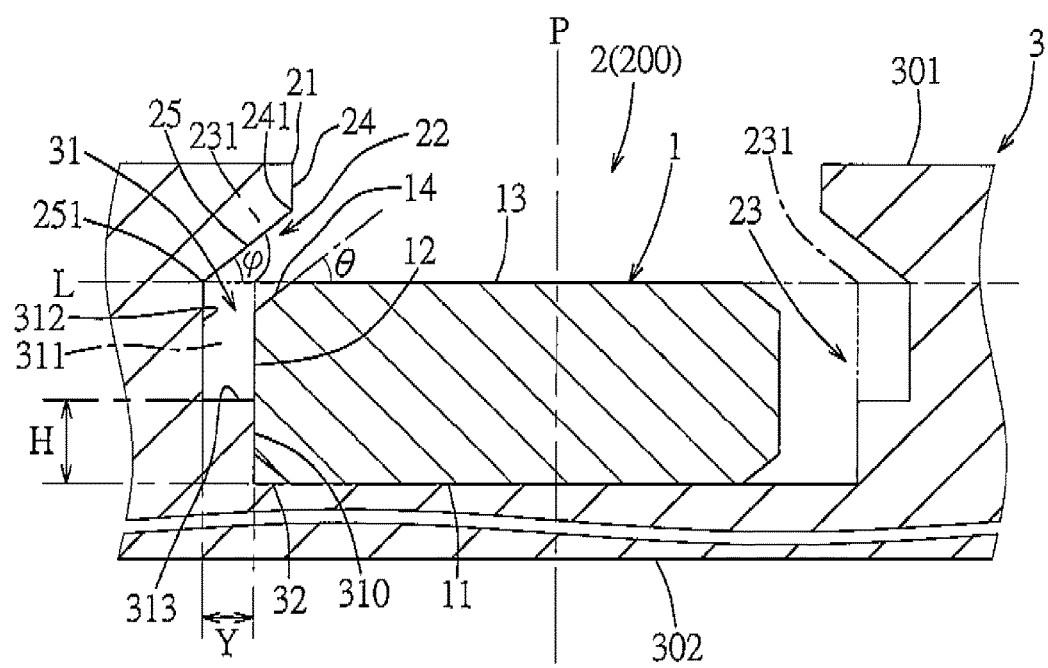
FIG. 2 is a fragmentary sectional view taken along line 2-2 of FIG. 1.

With reference to FIGS. 1 and 2, a wafer carrier for processing a plurality of wafers 1 according to a first embodiment of the disclosure is shown to include a carrier body 3 and a plurality of pockets 2. Each of the wafers 1 has a top bevel edge 14 and an outer periphery including an orientation flat 12.

The carrier body 3 is rotatable about a central axis (C), and has an upper surface 301 and a lower surface 302 opposite to the upper surface 301 in a direction of the central axis (C). In this embodiment, the carrier body 3 is made of graphite coated with silicon carbide, and is in a disc-shaped form.

The pockets 2 are angularly displaced from each other about the central axis (C). It should be noted that the number and arrangement of the pockets 2 may be varied based on requirement, and should not be limited to this embodiment. Each of the pockets 2 defines a pocket axis (P) and has an access opening 21 and an inner peripheral surface 22.

The access opening 21 is formed in the upper surface 301. In this embodiment, the access opening 21 is a circular opening.

The inner peripheral surface 22 extends from the access opening 21 toward the lower surface 302 to terminate at a floor surface 32 so as to define an accommodation space 200 configured to permit a corresponding one of the wafers 1 to be placed therein through the access opening 21. In this embodiment, the floor surface 32 is a flat surface on which a bottom surface 11 of the corresponding one of the wafers 1 is placed. In other embodiments, the floor surface 32 may be patterned to have a convex or concave shape such that the corresponding one of the wafers 1 can be heated more evenly through the carrier body 3 in a chemical vapor deposition process.

The inner periphery surface 22 has a lower periphery region 23 proximate to the floor surface 32, an uppermost region 24 distal from the floor surface 32, and a circumferential inclined ceiling region 25 disposed between the lower periphery region 23 and the uppermost region 24.

The uppermost region 24 extends from the access opening 21 to terminate at a circumferential juncture area 241.

The circumferential inclined ceiling region 25 extends downwardly from the circumferential juncture area 241 and radially and outwardly from the pocket axis (P) to terminate at a joint region 251. The circumferential inclined ceiling region 25 is configured to confront the top bevel edge 14 of the corresponding one of the wafers 1. The joint region 251 is disposed not higher than a top surface 13 of the corresponding one of the wafers 1. The circumferential inclined ceiling region 25 is provided to prevent running out of the corresponding one of the wafers 1 due to a high rotation speed of the carrier body 3.

Furthermore, the circumferential inclined ceiling region 25 is inclined by an inclined angle ($\varphi$) relative to a reference line (L) parallel to the floor surface 32. To prevent running out of the corresponding one of the wafers 1, the inclined angle ($\varphi$) should be less than 90° and be not less than an included angle ($\theta$) between the reference line (L) and the top bevel edge 14 of the corresponding one of the wafers 1. In this embodiment, the inclined angle ($\varphi$) is substantially the same as the included angle ($\theta$). In other embodiments, the inclined angle ($\varphi$) is not greater than the included angle ($\theta$) plus 30°, i.e., a different between the inclined angle ($\varphi$) and the included angle ($\theta$) is not greater than 30°.

In addition, a shortest distance between the circumferential inclined ceiling region 25 and the top bevel edge 14 of the corresponding one of the wafers 1 is not less than 10 microns so as to prevent the circumferential inclined ceiling region 25 from engaging the top bevel edge 14.

The lower periphery region 23 has a larger dimension than the access opening 21, and extends upwardly from a marginal edge of the floor surface 32 to terminate at an upper edge 231 which is leveled with the joint region 251. The lower periphery region 23 has a most distal zone 31 which is most distal from the central axis (C). The most distal zone 31 extends along a curved line (not shown) which is parallel to a contour of the access opening (circular opening) 21, and is configured such that only the most distal zone 31 is permitted to be engaged with the corresponding one of the wafers 1 when the carrier body 3 is rotated about the central axis (C). The most distal zone 31 has a non-cutout portion 310, and a cutout portion 311 which extends downwardly from the upper edge 231 to form a niche 312 which is disposed higher than the floor surface 32. After the wafers 1 are disposed in the pockets 2 and the carrier body 3 is driven to rotate, only the most distal region 31 of each pocket 2 may engage the orientation flat 12 or the outer periphery other than the orientation flat 12 of the corresponding one of the wafers 1.

In this embodiment, the remaining of the lower periphery region 23, other than the most distal region 31, also has a cutout portion 314 configured similar to the cutout portion 311.

In this embodiment, the niche 312 has a niche bottom 313 having a length (Y) which extends in a radial direction relative to the pocket axis (P), and which is not less than 10 microns. In addition, the niche 312 is disposed higher than the floor surface 32 by a height (H) which is substantially the same as the height of the non-cutout portion 310, and which is not less than a half thickness of the corresponding one of the wafers 1. If the height (H) is too small, the engagement between the most distal region 31 and the corresponding one of the wafers 1 is not sufficient, i.e., the engaging surface between the most distal region 31 and the corresponding one of the wafers 1 is too small which may result in defects or damages generated on the surface or edges of the wafers 1.

Figure 3:
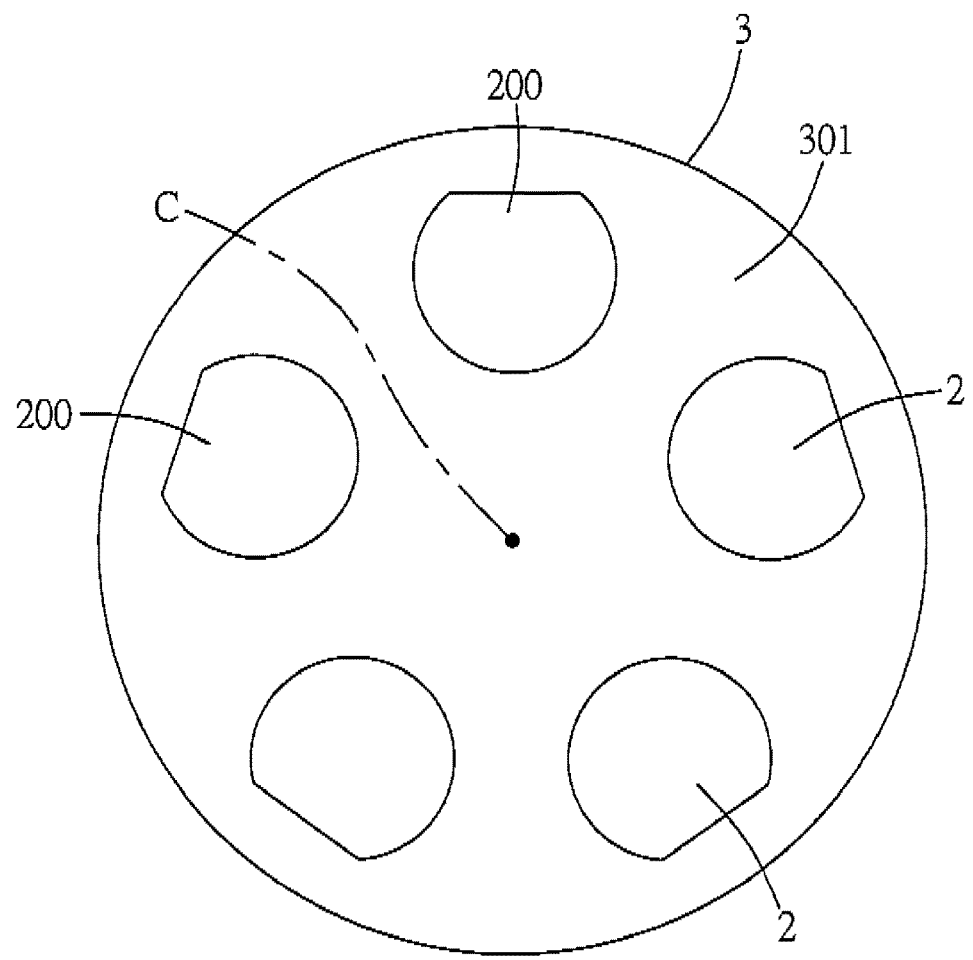
FIG. 3 is a top schematic view of a wafer carrier according to a second embodiment of the disclosure.
Figure 4:
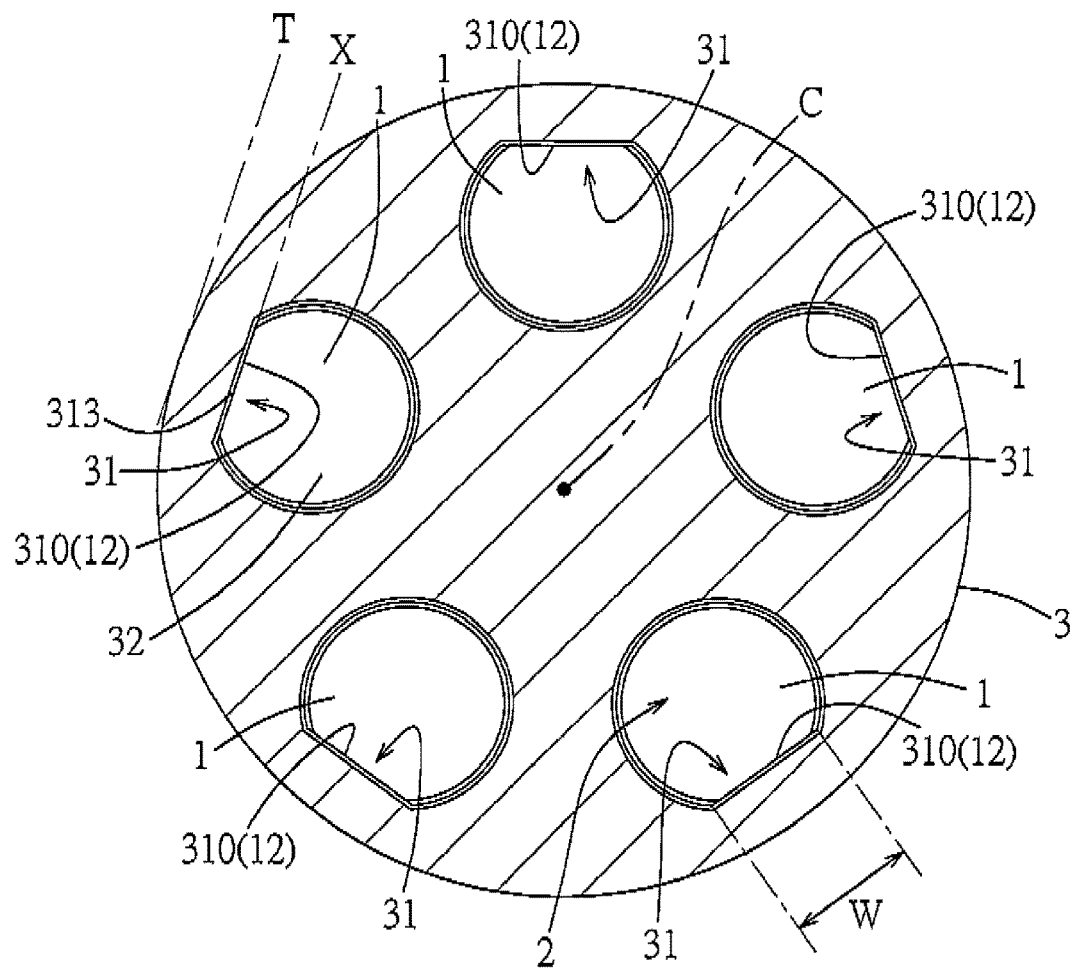
FIG. 4 is a transverse sectional view of FIG. 3 for illustrating a flat plane of a most distal region of an inner periphery of each pocket.

FIGS. 3 and 4 illustrate a wafer carrier according to a second embodiment of the disclosure. The second embodiment is similar to the first embodiment, except that in the second embodiment, an non-cutout portion 310 of the most distal zone 31 defines a flat plane (also denoted by 310) which extends along a straight line (X) parallel to a tangent line (T) relative to the central axis (C), and which has a width (W) along the straight line (X) not less than a length of the orientation flat 12 of the corresponding one of the wafers 1 (see also FIG. 2). When the carrier body 3 is rotated about the central axis (C), the flat plane 310 is engaged with the orientation flat 12 of the corresponding one of the wafers 1. It is found that when the flat plane 310 is engaged with the orientation flat 12 of the corresponding one of the wafers 1 during a chemical vapor disposition, the defects on a periphery of the corresponding one of the wafers 1 may be greatly reduced. Although the most distal zone 31 shown in FIGS. 3 and 4 has a cutout portion 311, in other embodiments, the most distal zone 31 may be a flat plane 310 without the cutout region 311. In this case, a centrifugal force applied to the orientation flats 12 of the wafers 1 may be more evenly distributed to the flat planes 310 of the pockets 2. As such, the wafers 1 are less likely to be damaged due to the applied centrifugal force.

Figure 5:
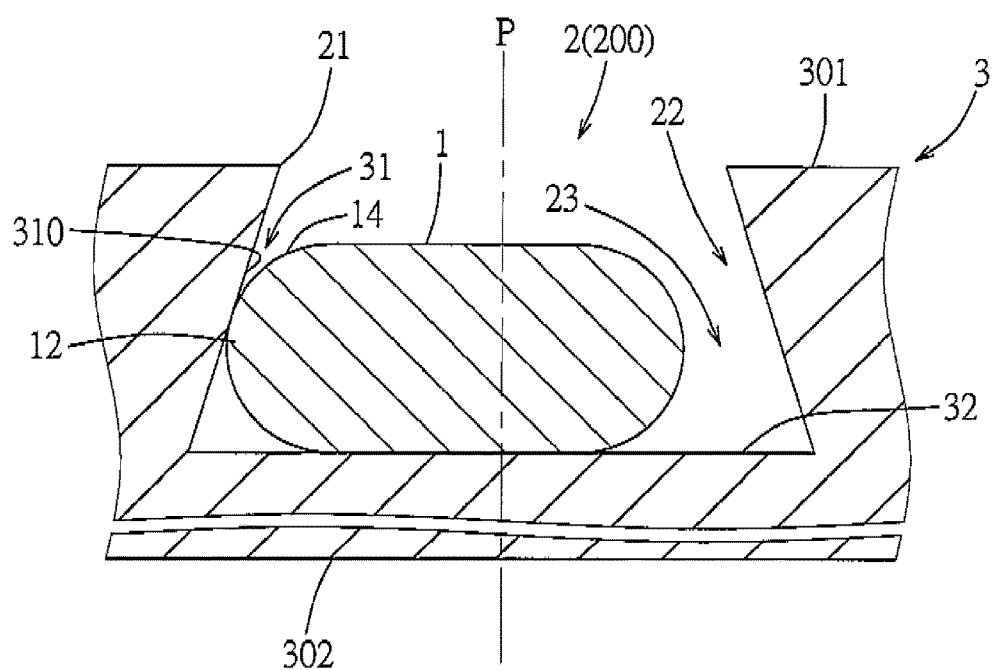
FIG. 5 is a sectional view of a wafer carrier according to a third embodiment of the disclosure.

FIG. 5 illustrates a wafer carrier according to a third embodiment of the disclosure. The third embodiment is similar to the second embodiment, except that in the third embodiment, the inner periphery surface 22 extends downwardly from the access opening 21 and radially and outwardly from the pocket axis (P) toward the lower surface 302 to terminate at the floor surface 32. The inner periphery surface 22 has a lower periphery region 23 which has a most distal zone 31 that is most distal from the central axis (C), and that is configured to be engageable with the corresponding one of the wafers 1 when the carrier body 3 is rotated about the central axis (C). The most distal zone 31 defines a flat plane 310 similar to the flat plane 310 of the second embodiment. When the carrier body 3 is rotated about the central axis (C) (see also FIG. 3), the flat plane 310 is engaged with the orientation flat 12 of the corresponding one of the wafers 1. In this case, a centrifugal force applied to the orientation flats 12 of the wafers 1 may be more evenly distributed to the flat planes 310 of the pockets 2. As such, the wafers 1 are less likely to be damaged due to the applied centrifugal force.

The embodiments of the disclosure will now be explained in more detail below by way of the following examples.

In following pockets of pocket examples 1-5, 6-inch silicon wafers (111) (first wafers, thickness: 1000 micron) were prepared for treating. Each wafer, as the wafer 1 shown in FIG. 4, had a top bevel edge with a bevel length of 350 microns and an orientation flat of 57.5 mm. An included angle ($\theta$) between a top surface and the top bevel edge of each wafer was 24°.

In pocket of pocket example 6, another 6-inch silicon wafer (111) (second wafer, thickness: 1000 micron) was prepared, and was similar to the first wafer except that the second wafer had a rounded edge as shown in FIG. 5.

Pocket Example 1 (PE 1)

A pocket of PE 1 was a conventional pocket, and had a circular access opening similar to the access opening 21 shown in FIG. 1 and an inclined inner periphery wall similar to the inner periphery wall shown in FIG. 5.

Pocket Example 2 (PE 2)

A pocket of PE 2 had a configuration similar to the pockets in the second embodiment. In the pocket of PE 2, similar to the pocket of PE 1, the inclined angle (φ) of the circumferential inclined ceiling region 25 was 24°, the height (H) of the non-cutout portion 310 was substantially the same as a half thickness of the 6-inch silicon wafers (111), and the length (Y) of the niche bottom 313 was 150 microns. With reference to FIGS. 2 and 4, the flat plane 310 in the pocket of PE 2 had a width (W) of 58 mm, and a shortest distance between the circumferential inclined ceiling region 25 and the top bevel edge 14 was 20 microns.

Pocket Example 3 (PE 3)

A pocket of PE 3 had a configuration similar to that of PE 2, except that, with reference to FIG. 2, the height (H) of the non-cutout portion 310 was substantially the same as ⅔ thickness of the 6-inch silicon wafers (111).

Pocket Example 4 (PE 4)

A pocket of PE 4 had a configuration similar to that of PE 2, except that, with reference to FIG. 2, the height (H) of the non-cutout portion 310 was close to the thickness of the 6-inch silicon wafers (111).

Pocket Example 5 (PE 5)

A pocket of PE 5 had a configuration similar to that of PE 2, except that, with reference to FIG. 2, the height (H) of the non-cutout portion 310 was substantially the same as ⅓ thickness of the 6-inch silicon wafers (111).

Pocket Example 6 (PE 6)

A pocket of PE 6 had a configuration similar to the pockets in the third embodiment. In other words, the pocket of PE 6 had an access opening configured to permit access of a wafer, and an inner periphery surface which extended downwardly from the access opening and radially and outwardly from a pocket axis to terminate at a floor surface. The inner periphery surface had a most distal zone defining a flat plane to be engaged with a wafer.

A plurality of wafers were disposed in the pockets of PE 1 to 6 of a wafer carrier for semiconductor epitaxial processes, and then the wafer carrier was set to rotate at 1000 rpm, and to be heated at 1060° C. for 1 hour. Thereafter, slip lines on the wafers were observed and the results thereof are shown in Table 1.

TABLE 1

| Pocket | PE 1 | PE 2 | PE 3 | PE 4 | PE 5 | PE 6 |
|---|---|---|---|---|---|---|
| Height ratio | n/a | ½ | ⅔ | ≈1 | ⅓ | n/a |
| Centrifugal Force (Kg) | 7.32 | 7.32 | 7.32 | 7.32 | 7.32 | 7.32 |
| Engaging area (cm²) | <0.0314 | 0.2524 | 0.3634 | 0.5238 | 0.1679 | <0.0575 |
| Pressure (Kg/cm²) | >233.12 | 29.00 | 20.143 | 139.75 | 43.597 | >127.3 |
| Slip line length (mm) | 2.7 | 2 | 1.7 | 1.2 | 3 | 1.3 |
| Slip line density (/cm²) | >3449 | na | na | <69 | na | <103 |

"Height ratio" means a ratio of a height of the non-cutout region of the most distal zone to a thickness of the corresponding 6-inch silicon wafer.
"Engaging area" is a surface area of a most distal zone in the respective pocket which was engaged with the corresponding 6-inch silicon wafer.
"na" means that the value was not measured.

It can be noted from the results of pocket examples 2 to 5 that the greater the engaging area of the pocket, the shorter the slip line will be. When the height ratio is not less than ½ (pocket examples 2 to 4), the length of the slip line is shorter than 2.7 mm. Especially, when the height ratio is close to 1 (i.e., the pocket of pocket example 4 which had the largest engaging area), the length of the slip line is shortest.

Furthermore, please note that the pockets of the pocket examples 1 and 6 similarly had an inclined inner peripheral surface similar to FIG. 5, except that the pocket of the pocket example 6 had a most distal zone with a flat plane to be engageable with the orientation flat of the 6-inch silicon wafer. It can be found that with the provision of the most distal zone with the flat plane, the density of slip lines would be greatly reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A wafer carrier comprising:
a carrier body which is rotatable about a central axis, and which has an upper surface and a lower surface opposite to said upper surface in a direction of the central axis; and a plurality of pockets which are angularly displaced from each other about the central axis, each of said pockets defining a pocket axis, and having an access opening formed in said upper surface, and an inner peripheral surface extending from said access opening toward said lower surface to terminate at a floor surface so as to define an accommodation space, said inner periphery surface having an uppermost region which extends from said access opening to terminate at a circumferential juncture area, a circumferential inclined ceiling region which extends downwardly from said circumferential juncture area and radially and outwardly from the pocket axis to terminate at a joint region, and a lower periphery region extending upwardly from a marginal edge of said floor surface to terminate at an upper edge which is leveled with said joint region, said lower periphery region having a most distal zone which is most distal from the central axis.

2. The wafer carrier according to claim 1, wherein said most distal zone has a cutout portion which extends downwardly from said upper edge to form a niche which is disposed higher than said floor surface.

3. The wafer carrier according to claim 1, wherein said most distal zone defines a flat plane which extends along a straight line parallel to a tangent line relative to the central axis, and which has a width along the straight line.

4. The wafer carrier according to claim 2, wherein said circumferential inclined ceiling region is inclined by an inclined angle relative to a reference line parallel to said floor surface, said inclined angle being less than 90°.

5. The wafer carrier according to claim 2, wherein said niche has a niche bottom having a length which extends in a radial direction relative to the pocket axis, and which is not less than 10 microns.

6. The wafer carrier according to claim 2, wherein said niche is disposed higher than said floor surface.

7. An assembly comprising a plurality of wafers each having a top bevel edge and an orientation flat, and a wafer carrier for processing said wafers, said wafer carrier including:

a carrier body which is rotatable about a central axis, and which has an upper surface and a lower surface opposite to said upper surface in a direction of the central axis; and a plurality of pockets which are angularly displaced from each other about the central axis, each of said pockets defining a pocket axis, and having an access opening formed in said upper surface, and an inner peripheral surface extending from said access opening toward said lower surface to terminate at a floor surface so as to define an accommodation space which is configured to permit a corresponding one of said wafers to be placed therein through said access opening, said inner periphery surface having an uppermost region which extends from said access opening to terminate at a circumferential juncture area, a circumferential inclined ceiling region which extends downwardly from said circumferential juncture area and radially and outwardly from the pocket axis to terminate at a joint region, and which is configured to confront said top bevel edge of the corresponding one of said wafers, and a lower periphery region extending upwardly from a marginal edge of said floor surface to terminate at an upper edge which is leveled with said joint region, said lower periphery region having a most distal zone which is most distal from the central axis, and which is configured such that only said most distal zone is permitted to be engaged with the corresponding one of said wafers when said carrier body is rotated about the central axis.

8. The assembly according to claim 7, wherein said most distal zone has a cutout portion which extends downwardly from said upper edge to form a niche which is disposed higher than said floor surface.

9. The assembly according to claim 7, wherein said most distal zone defines a flat plane which extends along a straight line parallel to a tangent line relative to the central axis, and which has a width along the straight line not less than a length of said orientation flat of the corresponding one of said wafers such that when said carrier body is rotated about the central axis, said flat plane is engaged with said orientation flat of the corresponding one of said wafers.

10. The assembly according to claim 8, wherein said circumferential inclined ceiling region is inclined by an inclined angle relative to a reference line parallel to said floor surface, said inclined angle being less than 90° and being not less than an included angle between the reference line and said top bevel edge of the corresponding one of said wafers.

11. The assembly according to claim 10, wherein said inclined angle is substantially the same as said included angle.

12. The assembly according to claim 10, wherein said inclined angle is not greater than said included angle plus 30°.

13. The assembly according to claim 7, wherein a shortest distance between said circumferential inclined ceiling region and said top bevel edge of the corresponding one of said wafers is not less than 10 microns.

14. The assembly according to claim 8, wherein said niche has a niche bottom having a length which extends in a radial direction relative to the pocket axis, and which is not less than 10 microns.

15. The assembly according to claim 8, wherein said niche is disposed higher than said floor surface by a height which is not less than a half thickness of the corresponding one of said wafers.

* * * * *